United States Patent
Xia

(10) Patent No.: US 7,682,483 B2
(45) Date of Patent: Mar. 23, 2010

(54) VACUUM PROCESSING CHAMBER AND METHOD OF PROCESSING A SEMICONDUCTOR WORK PIECE

(75) Inventor: Yaomin Xia, San Jose, CA (US)

(73) Assignee: Advanced Micro-Fabrication Equipment, Inc. Asia, Grand Cayman (KY)

( * ) Notice: Subject to any disclaimer, the term of this patent is extended or adjusted under 35 U.S.C. 154(b) by 828 days.

(21) Appl. No.: 11/440,738

(22) Filed: May 24, 2006

(65) Prior Publication Data
US 2007/0039165 A1   Feb. 22, 2007

(30) Foreign Application Priority Data
Aug. 5, 2005   (CN)   ............. 2005 1 0028573

(51) Int. Cl.
  *H01L 21/00*   (2006.01)
(52) U.S. Cl. ............... 156/345.47; 118/723 E
(58) Field of Classification Search ............ 118/723 E; 156/345.43, 345.44, 345.45, 345.46, 345.47
  See application file for complete search history.

(56) References Cited

U.S. PATENT DOCUMENTS

| | | | | |
|---|---|---|---|---|
| 5,919,332 A | * | 7/1999 | Koshiishi et al. | 156/345.47 |
| 6,199,505 B1 | * | 3/2001 | Sato et al. | 118/723 E |
| 6,346,915 B1 | * | 2/2002 | Okumura et al. | 343/701 |
| 6,427,621 B1 | | 8/2002 | Ikegawa et al. | |
| 6,808,759 B1 | * | 10/2004 | Okumura et al. | 427/569 |

FOREIGN PATENT DOCUMENTS

JP    03044028 A   *   2/1991

* cited by examiner

*Primary Examiner*—Parviz Hassanzadeh
*Assistant Examiner*—Michelle Crowell
(74) *Attorney, Agent, or Firm*—Nixon Peabody LLP; Joseph Bach, Esq.

(57) ABSTRACT

A vacuum processing chamber and method of using a vacuum processing chamber are described and which includes a chamber defined by a chamber body, and wherein the chamber body defines an internal cavity; first and second electrodes are mounted in the internal cavity as defined by the chamber body; an RF generator is provided, and which produces single or multiple frequencies and which is electrically coupled to at least one of the first or second electrodes, and which are operable, when energized, to produce a plasma within the internal cavity of the chamber body; and an adjustable component borne by the chamber body, and which is fabricated, at least in part, from a dielectric material, and which selectively adjusts the equivalent dielectric constant which exists between the chamber body and the first electrode.

13 Claims, 10 Drawing Sheets

VACUUM PROCESSING CHAMBER AND METHOD OF PROCESSING A SEMICONDUCTOR WORK PIECE

RELATED PATENT DATA

The present application claims priority from Chinese Patent Application Serial No. 200510028573.6, filed on Aug. 5, 2005.

TECHNICAL FIELD

The present invention relates to a vacuum processing chamber and method of processing a semiconductor work piece, and more specifically to an apparatus and method which provides a means for varying a dielectric constant which exists therebetween a first electrode and the chamber body of the same vacuum processing chamber.

BACKGROUND OF THE INVENTION

In the processing of a semiconductor work piece, those skilled in the art have long understood the problem associated with the so-called "edge effect." More specifically, in the processing of semiconductor work pieces, where plasma is employed, it should be understood that the plasma is controlled by an electrical field where it has long been understood that the electrical field strength at the edge of the upper and lower electrodes may be effected to such a degree that there will be bent electrical field lines. This edge effect provides a non-uniform electrical field strength at the edge and consequently leads to a non-uniform density of plasma in that same region. With the presence of a non-uniformly dense plasma in that region, the peripheral edge about a semiconductor work piece is often not uniformly processed.

As semiconductor work pieces have increased in size, the edge effect has caused a decrease in the yield rate. Presently, where a 300 mm procedure is widely employed in the industry, the edge effect is causing increasingly heavier losses. Those skilled in the art have attempted to mitigate the edge effect by employing various measures. For example, and as best seen in FIG. 1, a prior art assembly is shown. In the arrangement as seen in FIG. 1, a semiconductor work piece 10 is located within a vacuum processing chamber 11 which has an upper electrode 12, and a lower electrode 13 which is spaced therefrom. The vacuum processing chamber has a chamber body 14. The upper electrode 12 is grounded through the chamber body 14. As seen in that view, there are large electric magnets 15 which are positioned around the chamber body. The vacuum processing chamber 11 also is electrically coupled to a high frequency RF generator 16, and a low frequency RF generator 17. Each of these generators is operable to supply low frequency or high frequency electrical energy to form a plasma 18 within the processing chamber 11. When the plasma 18 is formed in the chamber body 14, the electric magnets 15 are energized to form a magnetic field which controls the distribution of the electrical field in the chamber body and thereby increase the yield processing results of the vacuum processing chamber 11. As should be understood, this apparatus is relatively expensive to fabricate and further consumes a large amount of electrical energy. Still further, it has shortcomings inasmuch as its performance appears somewhat limited especially at the intersection of two magnetic fields.

Referring now to FIG. 2, another prior art assembly is illustrated which has been used to address the edge effect. Similar numbers relate to similar structure from that seen in FIG. 1. It should be understood in FIG. 2, this prior art embodiment of a vacuum processing chamber is designed in a manner whereby the upper electrode 12 is not directly grounded to the chamber body as seen in FIG. 1.

Another method to address the so-called edge effect is to adjust the gas flux being provided to the vacuum processing chamber. By adjusting the gas flux of the different gasses being supplied to generate a plasma, the correct plasma density is attempted to be achieved so as to eliminate or counteract the edge effect.

Still another method which has been employed heretofore to address the edge effect is to infuse a source of cooling water to the lower electrode thereby making the surface temperature of the semiconductor work pieces 10 different so as to influence the resulting plasma performance and adjust the uniformity of same. While these devices and methods have worked with various degrees of success, there are shortcomings attendant with their implementation. Further, the losses caused by the edge effect have not been effectively and completely eliminated thereby. In addition to the apparent shortcomings noted above, it should be understood that once a vacuum processing chamber has been manufactured, its size and the resulting electrical field formed in the vacuum processing chamber is relatively fixed. Consequently, the uniformity of the plasma becomes increasingly difficult to adjust. Consequently, in view of the many factors that might influence the distribution of an electrical field, manufacturing multiple devices which have identical electrical fields becomes increasingly difficult.

Therefore, a vacuum processing chamber and related method that substantially eliminate the edge effect in a simple and effective manner and which further can be adjusted in various fashions to reduce the cost of manufacturing and increase the yield rates for semiconductor work pieces provided from same is the subject matter of the present application.

SUMMARY OF THE INVENTION

A first aspect of the present invention relates to a vacuum processing chamber which includes a chamber defined by a chamber body, and wherein the chamber body further defines an internal cavity; first and second electrodes mounted on the chamber body; an RF generator which produces single or multiple frequencies and which is electrically coupled to at least one of the first or second electrodes, and which is further operable, when energized, to produce a plasma within the internal cavity of the chamber body; and an adjustable component borne by the chamber body, and which is fabricated, at least in part, from a dielectric material, and which selectively adjusts the equivalent dielectric constant which exists between the chamber body and the first electrode.

Another aspect of the present invention relates to a vacuum processing chamber which includes a chamber defined by a chamber body, and wherein the chamber body further defines an internal cavity; first and second electrodes mounted on the chamber body; an RF generator which produces single or multiple frequencies and which is electrically coupled to at least one of the first or second electrodes, and which is further operable, when energized, to produce a plasma within the internal cavity of the chamber body; a ring which is fabricated, at least in part of a dielectric material, and which further defines a slot, and wherein the ring is positioned between the first electrode and the chamber body; and a liquid received in the slot which is defined by the ring.

Another aspect of the present invention relates to a vacuum processing chamber which includes a chamber defined by a chamber body, and wherein the chamber body further defines an internal cavity; first and second electrodes mounted on the chamber body; an RF generator which produces single or multiple frequencies and which is electrically coupled to at least one of the first or second electrodes, and which is further operable, when energized, to produce a plasma within the internal cavity of the chamber body; and a solid ring which is fabricated, at least in part of a dielectric material, and wherein the ring is positioned between the first electrode and the chamber body, and is further substantially vertically moveable along the chamber body.

Yet another aspect of the present invention relates to a vacuum processing chamber which includes a chamber defined by a chamber body, and wherein the chamber body further defines an internal cavity; first and second electrodes mounted on the chamber body; an RF generator which produces single or multiple frequencies and which is electrically coupled to at least one of the first or second electrodes, and which is further operable, when energized, to produce a plasma within the internal cavity of the chamber body; multiple rings which are fabricated, at least in part of a dielectric material, and which are positioned between the first electrode and the chamber body, and wherein at least one of the multiple rings is substantially vertically moveable along the chamber body, and wherein the multiple rings include a first ring which defines a slot, and a solid second ring; and a liquid which is received within the slot which is defined by the first ring.

Still another aspect of the present invention relates to a method of processing a semiconductor work piece which includes the steps of providing a chamber defined by a chamber body, and wherein the chamber body further defines an internal cavity; providing first and second electrodes and mounting the first and second electrodes on the chamber body; providing a semiconductor work piece, and delivering the semiconductor work piece into the internal cavity; providing a source of a gas and introducing the source of the gas into the internal cavity; providing an RF generator which produces single or multiple frequencies and which is electrically coupled to at least one of the first or second electrodes, and energizing at least one of the electrodes to produce a plasma from the gas which has been delivered into the internal cavity of the chamber body; positioning a ring defining a slot, and which is fabricated, at least in part, of a dielectric material, between the first electrode, and the chamber body; and delivering a source of a liquid into the slot to adjust an equivalent dielectric constant which exists between the first electrode and the chamber body.

Still another aspect of the present invention relates to a method of processing a semiconductor work piece which includes the steps of providing a chamber defined by a chamber body, and wherein the chamber body further defines an internal cavity; providing first and second electrodes and mounting the first and second electrodes on the chamber body; providing a semiconductor work piece, and delivering the semiconductor work piece into the internal cavity; providing a source of a gas and introducing the source of the gas into the internal cavity; providing an RF generator which produces single or multiple frequencies and which is electrically coupled to at least one of the first or second electrodes, and energizing at least one of the electrodes to produce a plasma from the gas which has been delivered into the internal cavity of the chamber body; and positioning a solid moveable ring which is fabricated, at least in part, of a dielectric material, between the first electrode, and the chamber body, and moving the solid ring along the chamber body.

Yet still another aspect of the present invention relates to a method of processing a semiconductor work piece and which includes the steps of providing a chamber defined by a chamber body, and wherein the chamber body further defines an internal cavity; providing first and second electrodes and mounting the first and second electrodes on the chamber body; providing a semiconductor work piece, and delivering the semiconductor work piece into the internal cavity; providing a source of a gas and introducing the source of the gas into the internal cavity; providing an RF generator which produces single or multiple frequencies and which is electrically coupled to at least one of the first or second electrodes, and energizing at least one of the electrodes to produce a plasma from the gas which has been delivered into the internal cavity of the chamber body; positioning multiple rings which are fabricated, at least in part, of a dielectric material, between the first electrode, and the chamber body, and moving at least one of the rings in a vertical direction along the chamber body, and wherein the multiple rings include a first ring which defines a slot, and a solid second ring; providing a liquid and delivering the liquid into the slot which is defined by the first ring; and adjusting an equivalent dielectric constant which exists between the first electrode and the chamber body by delivering the liquid into the slot which is defined by the first ring, and by moving the second ring relative to the chamber body.

Finally, the present invention relates to a method of processing a semiconductor work piece which includes the steps of providing a chamber having a chamber body and which defines an internal cavity for receiving a semiconductor work piece to be processed; mounting first and second electrodes on the chamber body; delivering a semiconductor work piece into the internal cavity of the chamber; providing a source of gas into the internal cavity; delivering a single or multiple frequencies of RF energy into the internal cavity by way of the first and second electrodes so as to create an electrical field having a field strength, and which forms a plasma from the source of the gas, and wherein the plasma has a peripheral edge; providing a material with a variable dielectric constant therebetween the first electrode and the chamber body; and adjusting the electrical field strength at the peripheral edge of the plasma with the material.

These and other aspects of the present invention will be described in greater detail hereinafter.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
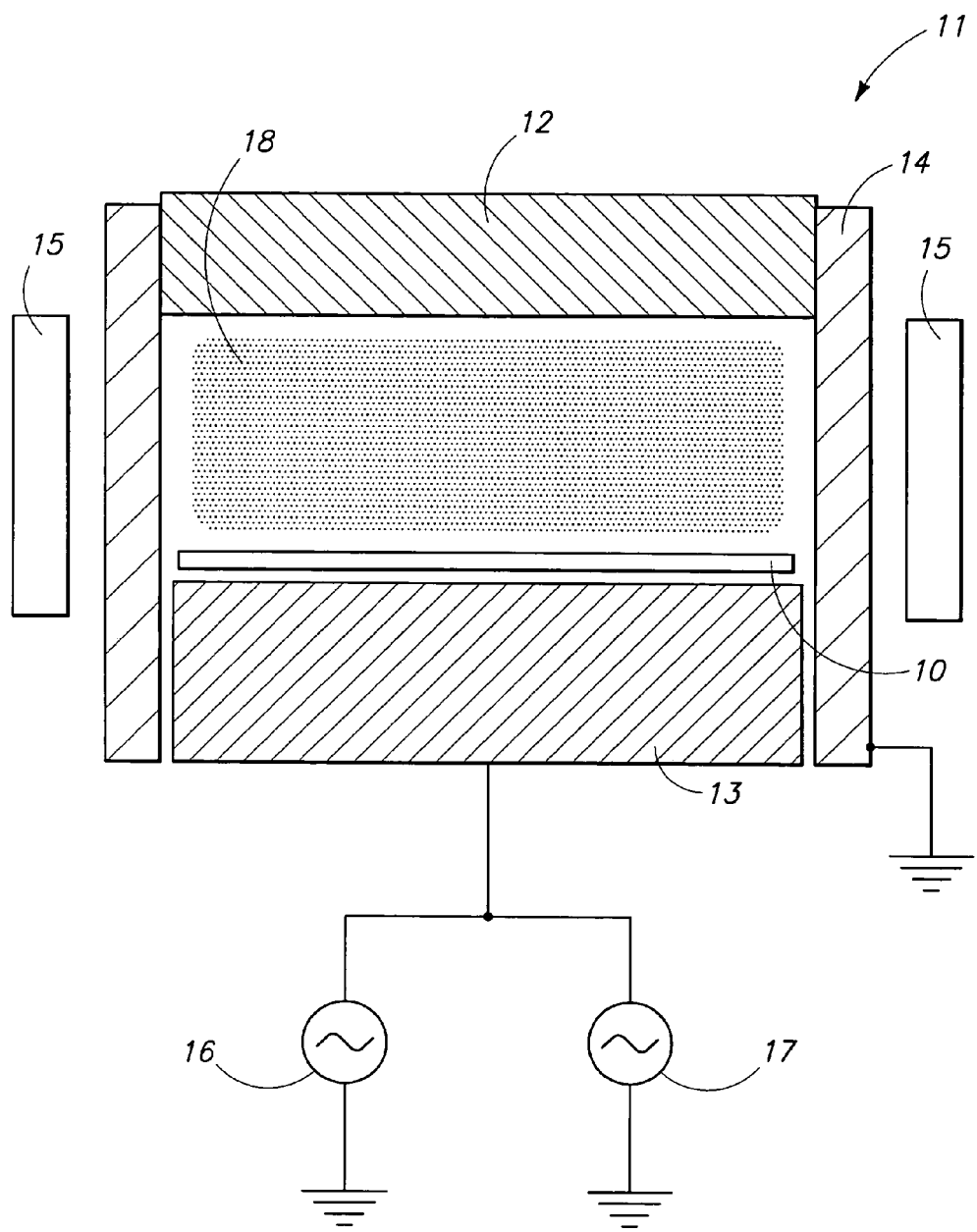
FIG. 1 is a greatly simplified, schematic view of a prior art vacuum processing chamber having an upper electrode which is directly grounded.
Figure 2:
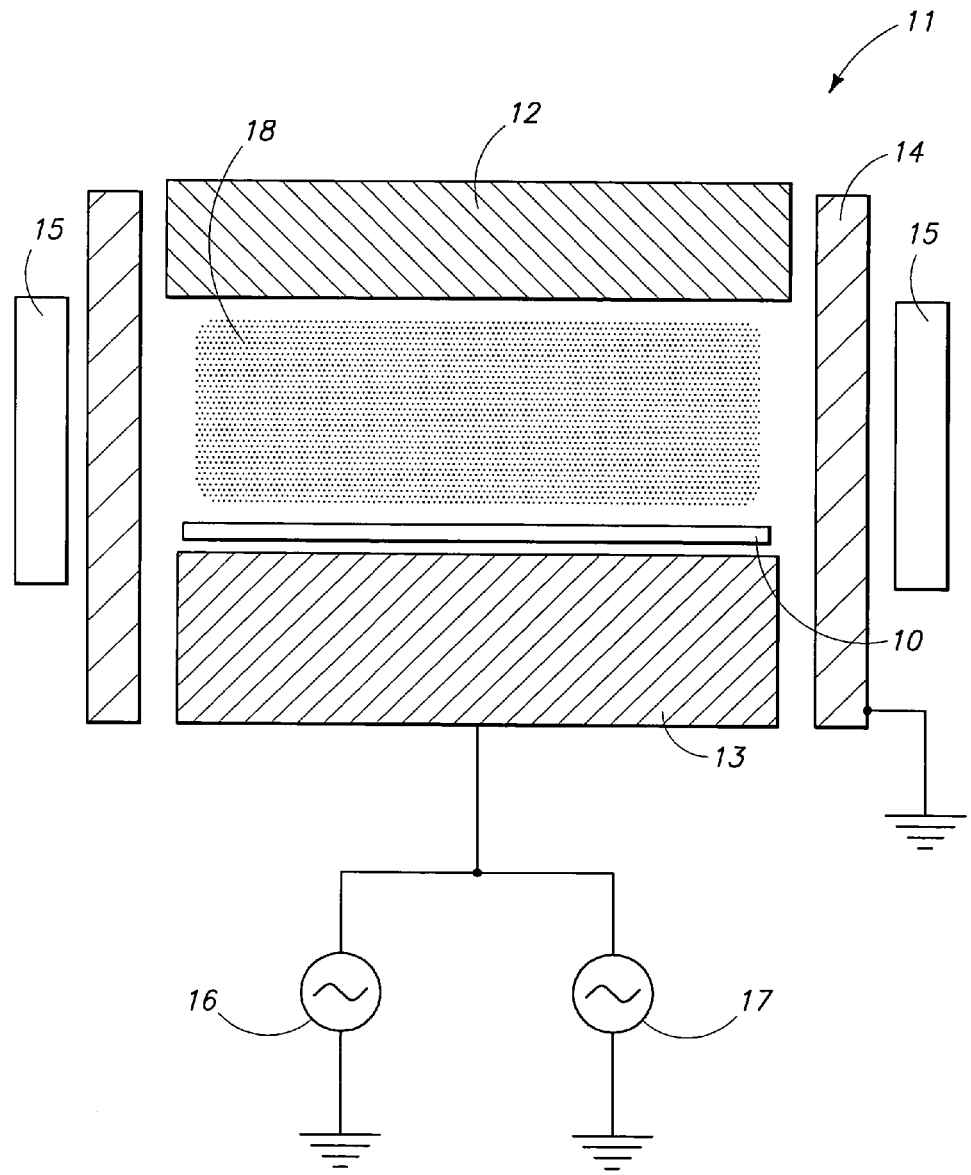
FIG. 2 is a greatly simplified, schematic view of a prior art vacuum processing chamber having an upper electrode which is indirectly grounded.

This disclosure of the invention is submitted in furtherance of the constitutional purposes of the U.S. Patent Laws "to promote the progress of science and useful arts" (Article 1, Section 8).

There are a number of forms to the invention as disclosed in FIG. 3-11, respectively. However, the principals of the present invention remain the same throughout all the forms of the invention as will be discussed, hereinafter. Principally, the present invention relates to an apparatus and methodology which is operable to change the parasitic capacitance which exists between a chamber body and the upper or first electrode. This change of the parasitic capacitance results in a change in the density of the electrical field at the edge of a semiconductor work piece which is being processed thereby improving the edge effect and reducing losses for the semiconductor work pieces which are being processed. More specifically, by adjusting the parasitic capacitance which exists between the edge of the plasma and the chamber body, the electrical field can be redistributed at the semiconductor work piece. Generally speaking, there are three factors which effect parasitic capacitance, namely, the peripheral edge of the upper or first electrode, and the interior facing surface of the chamber body; the distance between the edge of the upper or first electrode and the chamber body; and the equivalent dielectric constant of the space formed between the peripheral edge of the plasma and the chamber body. As best seen by reference to FIG. 3 and following, it is easy to understand that the area, and distance between the peripheral edge of the upper or first electrode and the chamber body becomes fixed after manufacturing. Still further, those skilled in the art would understand that the relationship between the parasitic capacitance and the electrical field distribution is quite complex and will be directly effected by different RF energy inputs. Consequently, it is quite difficult to precalculate and thereafter manufacture and produce a vacuum processing chamber with a proper parasitic capacitance. In view of the foregoing, the only factor that can be readily changed in the foregoing design is the equivalent dielectric constant which exists in the space between the plasma and chamber body.

The present invention is directed to a methodology and an apparatus which adjusts the equivalent dielectric constant in the same space between the plasma and the chamber body to achieve a proper parasitic capacitance and a resulting redistribution of the electrical field, and a further improvement in the plasma processing of semiconductor work pieces. In the several forms of the invention as will be discussed in greater detail hereinafter, at least one adjustable component which is fabricated from a dielectric material is located between the chamber body and the upper or first electrode so as to adjust the equivalent dielectric constant which exists between the chamber body and the upper or first electrode. As a first matter, the adjustable component, because it is fabricated of a dielectric material, and positioned as previously described between the chamber body and the upper electrode can result in a change in the equivalent dielectric constant which exists between the two. Still further, this equivalent dielectric constant can be further adjusted by adjusting the relative position of the adjustable component relative to the chamber body, and the upper or first electrode. More specifically, and to precisely adjust the equivalent dielectric constant, the present invention also provides a structure whereby the adjustable component defines a slot-like structure and further, a material is received in the slot and provides a means for adjusting the dielectric constant more precisely. The material which may be received in the slots includes such materials as a liquid or a solid. In one preferred embodiment as will be discussed in greater detail hereinafter, the preferred material is water.

Figure 3:
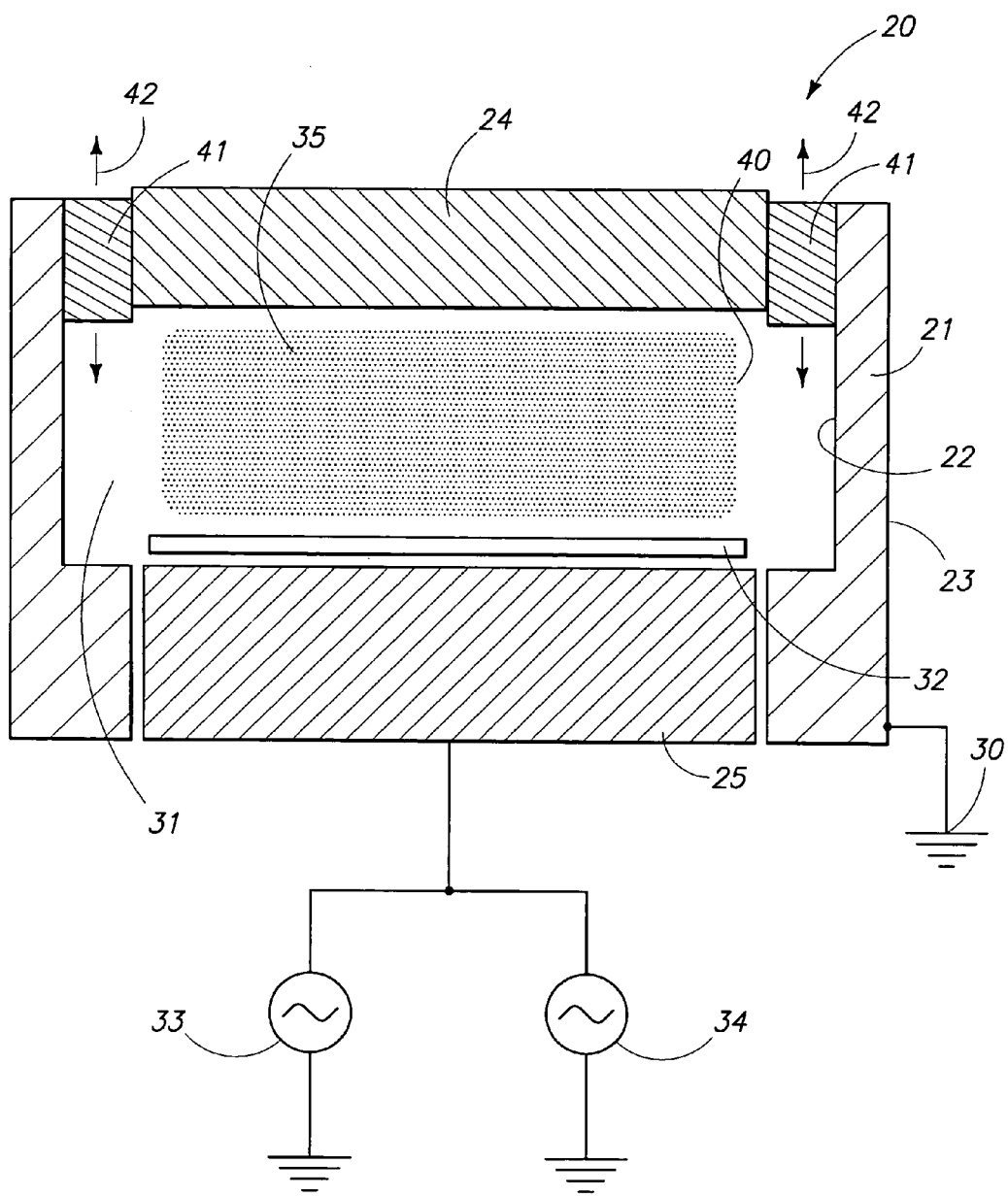
FIG. 3 is a greatly simplified, schematic view of one embodiment of the vacuum processing chamber of the present invention.

Referring now to FIG. 3, the first form of the invention includes a vacuum processing chamber which is generally indicated by the numeral 20, and which is defined, in part, by a chamber body 21. The chamber body 21 has an inside facing surface 22, and an opposite outside facing surface 23. Still further, the vacuum processing chamber 20 has a first or top electrode 24, and a second or bottom electrode 25. As seen in that drawing, the chamber body 21 is electrically grounded 30. An internal cavity 31 is defined between the inside facing surface 22 of the chamber body 21, and the first or top electrode 24, and the second or bottom electrode 25. As seen in that drawing, a semiconductor work piece 32 is positioned or otherwise supported on the second or bottom electrode 25. Still further, the second or bottom electrode 25 is electrically coupled with an HF or high frequency generator, and a low frequency generator 33 and 34, respectively. The respective generators 33 and 34 provide electrical energy to the second electrode 25 so as to generate a plasma 35 within the internal cavity 31 and which processes the semiconductor work piece 32. The plasma 35 has a peripheral edge 40.

As illustrated in FIG. 3, the first form of the invention 20 includes an adjustable component here illustrated as an adjustable ring 41 which is borne by the chamber body 21 and which is fabricated, at least in part, from a dielectric material. The adjustable component 41 selectively adjusts the equivalent dielectric constant which exists between the chamber body 21 and the first electrode 24. In the arrangement as seen in that drawing, the adjustable component, as shown therein, may be fixed relative to the chamber body 21. However, the adjustable component may also be moveable relative to the chamber body. As seen in FIG. 3, the adjustable component is a solid ring 41 which has the effect of adjusting the equivalent dielectric constant in the manner as described, above. The adjustable component 41 is located between the inwardly facing surface 22 of the chamber body 21 and the first electrode 24. Further, the path of movement 42 of the solid ring is substantially along the chamber body, and vertically relative to the first electrode 24.

Therefore, in one form of the invention, a vacuum processing chamber 20 is described and which includes a chamber body 21, and wherein the chamber body 21 further defines an internal cavity 31. First and second electrodes 24 and 25 are mounted on the chamber body 21 and are located within the internal cavity 31. Still further, an RF generator 33/34 produces single or multiple frequencies of electrical energy, and which is further electrically coupled to at least one of the first or second electrodes. The RF generators are further operable, when energized to produce a plasma 35 within the internal cavity 31 of the chamber body 21. In the present form of the invention, a solid ring 41 is fabricated, at least in part, of a dielectric material, and wherein the ring is positioned between the first electrode 24, and is further substantially vertically moveable along a path of travel 42 along the chamber body 21. In the present form of the invention, the dielectric material may be selected from the group comprising porcelain or a silicate.

Still referring to FIG. 3, a method of processing a semiconductor work piece is illustrated and which includes the steps of providing a processing chamber defined by a chamber body 21, and wherein the chamber body further defines an internal cavity 31; and providing first and second electrodes 24 and 25 and mounting the first and second electrodes on the chamber body 21, and within the internal cavity 31. The present methodology includes another step of providing a semiconductor work piece 32, and delivering the semiconductor work piece into the internal work piece into the internal cavity; and providing a source of a gas and introducing the source of gas into internal cavity. The present methodology includes another step of providing an RF generator 33/34 which produces single or multiple frequencies, and which is electrically coupled to at least one of the first or second electrodes 24 and 25, and energizing at least one of the electrodes to produce a plasma 35 from the gas which has been delivered into the internal cavity of the chamber body. The method of the present invention further includes another step of positioning a solid moveable ring 41 which is fabricated, at least in part, of a dielectric material, between the first electrode 24 and the chamber body 21 and moving the solid ring along the chamber body. In the present methodology, the dielectric material is selected from the group comprising porcelain and a silicate.

Another aspect of the present invention relates to a method of processing a semiconductor work piece 32 and which includes the steps of providing a processing chamber having a chamber body 21, and which defines an internal cavity 31 for receiving a semiconductor work piece 32 to be processed. The method further includes an additional step of mounting first and second electrodes 24 and 25 within the internal cavity 31 and delivering a semiconductor work piece 32 into the internal cavity of the chamber. The method includes another step of providing a source of gas into the internal cavity; and delivering a single or multiple frequencies of RF energy into the internal cavity by way of the first and second electrodes 24 and 25 so as to create an electrical field having a field strength, and which forms a plasma 35 from the source of the gas, and wherein the plasma 35 has a peripheral edge 40. Still further, the method includes another step of providing a material 41 with a variable dielectric constant therebetween the first electrode and the chamber body; and adjusting the electrical field strength at the peripheral edge 40 of the plasma 35 with the material. In the methodology as described above, the material may comprise water or porcelain as will be discussed in greater detail hereinafter.

Figure 4:
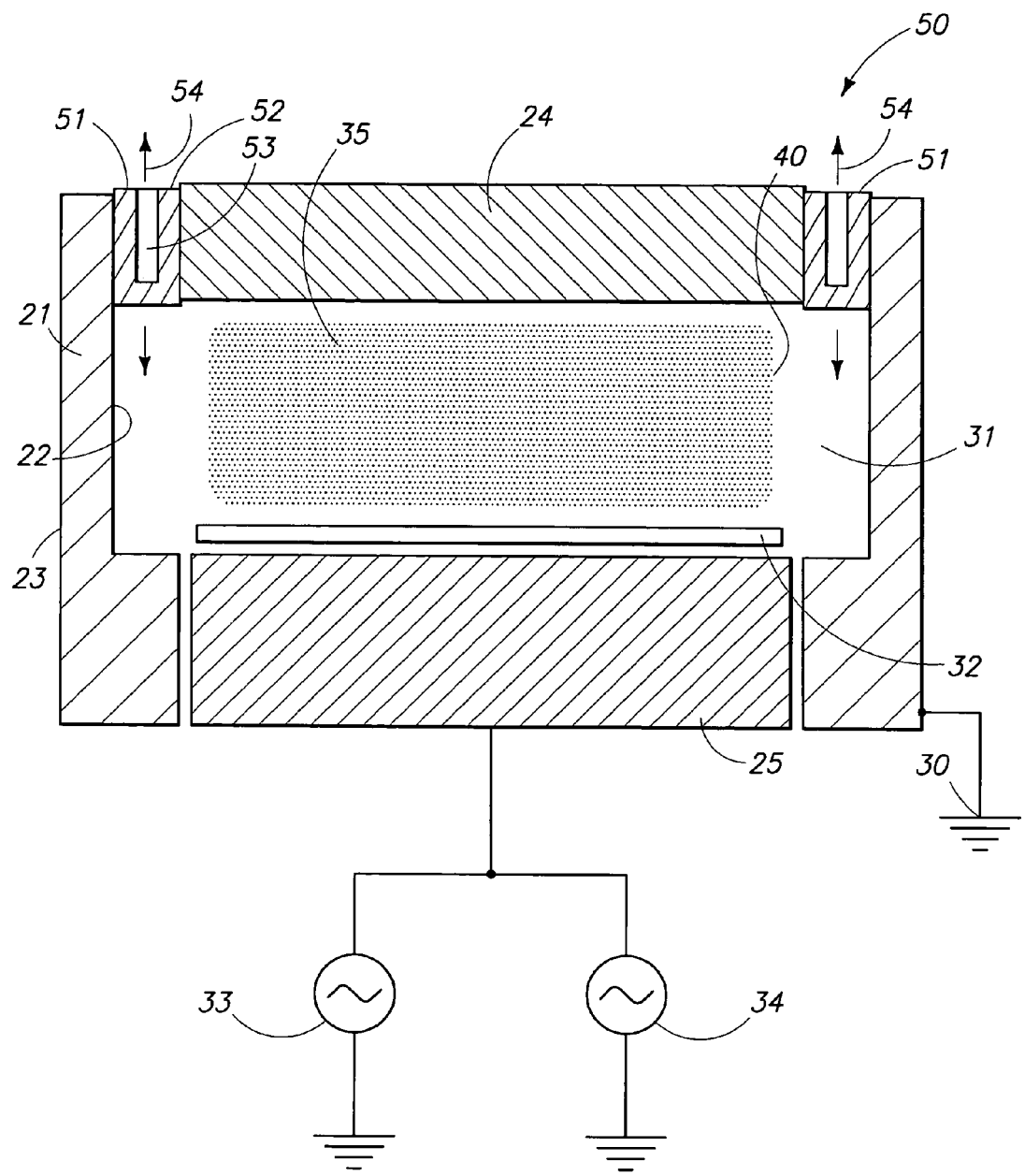
FIG. 4 is a greatly simplified, schematic view of another embodiment of the vacuum processing chamber of the present invention.

Referring now to FIG. 4, a second form of the vacuum processing chamber of the present invention is generally indicated by the numeral 50, therein. As should be understood, common structures bear common numbers from that previously described in FIG. 3. With respect to the second form of the invention 50, the present invention includes an adjustable, substantially hollow ring which is generally indicated by the numeral 51, and which is fabricated of a dielectric material and which is operable to move along a path of travel 54 which is positioned substantially along, and between, the chamber body 21 and the first or top electrode 24, so as to adjust the equivalent dielectric constant as described earlier. As seen in that view, the hollow ring 51 defines a slot 53 which, in other forms of the invention, are operable to receive a material which can further change the equivalent dielectric constant. In this form of the invention 50, it should be understood that the ring 51, defining the slot 53, comprises an adjustable component, which may, in one form of the invention, be fixed relative to the chamber body 21, or in the form of the invention as seen in FIG. 4, is moveable relative to the chamber body 21. The ring 51, having the slot 53, may receive a material which may adjust the equivalent dielectric constant. In the form of the invention as seen in this drawing, the adjustable component, in the form of the ring 51, is located between the inwardly facing surface 22 of the chamber body 21 and the first electrode 24.

Figure 5:
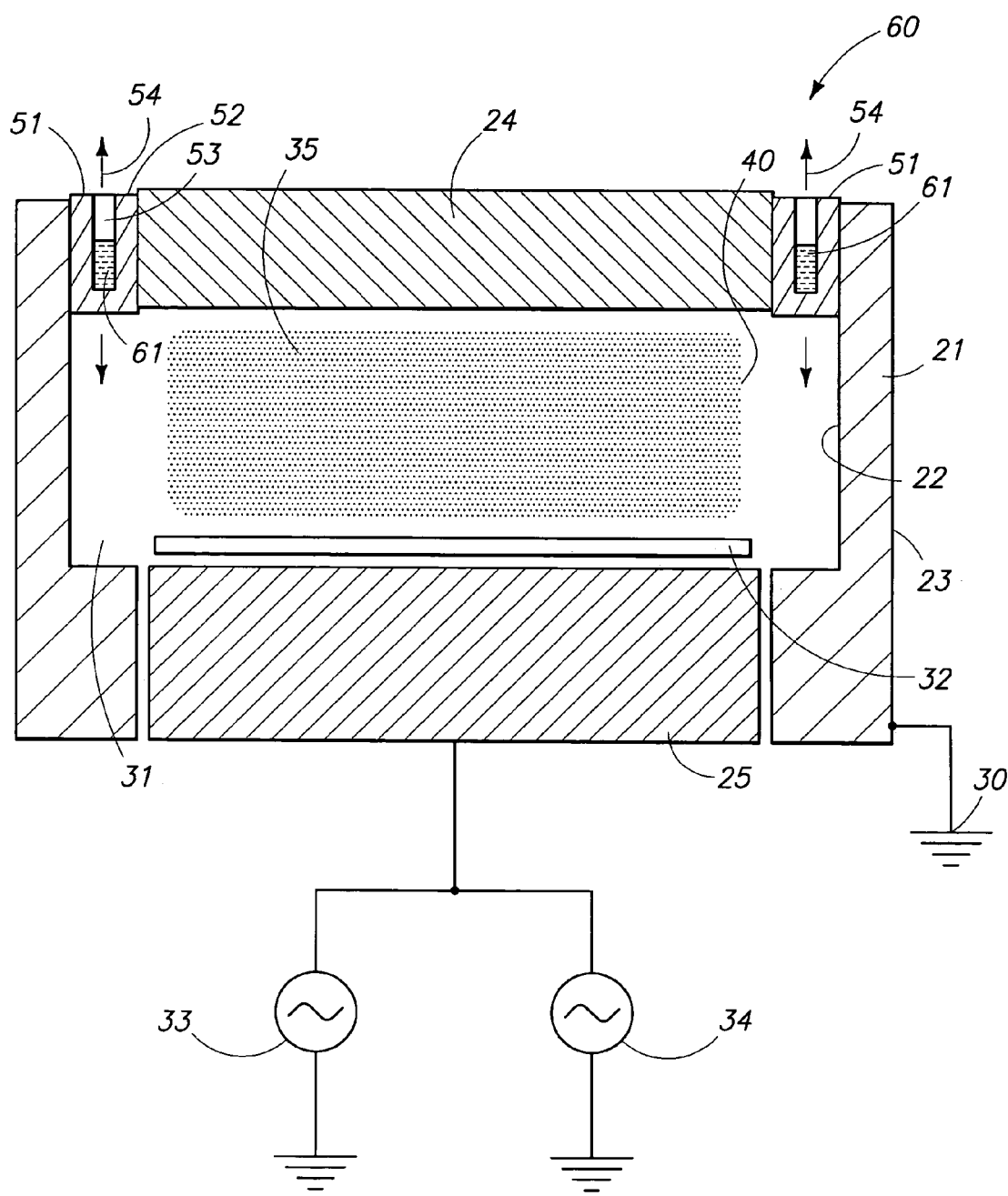
FIG. 5 is a greatly simplified, schematic view of yet another embodiment of the present invention.

A third form of the invention is generally indicated by the numeral 60, and is best seen by reference to FIG. 5. As should be understood, similar structures bear similar numbers. In the third form of the invention 60, as seen, the present invention includes a liquid, such as water 61, which is received within the slot 53 of the hollow ring 51, and which is positioned between the first or top electrode 24, and the inside facing surface 22 of the chamber body 21. In this third form of the invention 60, it should be understood that the hollow ring 51 defining the slot 53 may be moveable along a path of travel 54 as indicated. Further, and in another possible form of the invention, the hollow ring 51 may be substantially stationary. In this form of the invention, a liquid 61 can be infused or otherwise delivered into the slot 53 to adjust the dielectric constant. In the arrangement as seen in FIG. 5, the hollow ring 51 defining the slot 53 may be fabricated from porcelain or from a silicate material. As earlier discussed, the liquid which is received in the slot can be water. As should be understood, the dielectric constant of a gas is about 1.00054 and the dielectric constant of porcelain is about 9. Still further, the dielectric constant of water is as high as 80.4. As seen in FIG. 5, the top surface 52 of the hollow ring can extend out of the vacuum processing chamber 20 so as to facilitate the infusion or removal of the liquid 61 therefrom. As should be understood, and in the form of the invention where the hollow ring is movable along a path of travel 54, it will be appreciated that as the ring moves downwardly into the internal cavity 31, the dielectric constant in the internal cavity 31 will gradually change from a complete gas to an average which is proportional to the gas and porcelain, namely, it will increase from about 1 to some value smaller than about 9. Consequently, when this is achieved, the parasitic capacitance of the present vacuum processing chamber 20 can be refined. This refinement is done by infusing water into the slot 53. Thus, the dielectric constant in the internal cavity 31 will change from a porcelain and gas mixture to an average of porcelain and water. Inasmuch as the dielectric constant of water is about 80.4, the adjusting range for this dielectric constant can vary widely. Therefore, in the present form of the invention, the dielectric constant can be adjusted in two fashions, that is, one, by adjusting the relative position of the hollow ring 51 relative to the inside facing surface of the chamber body, and two, infusing a liquid 61 such as water into the slot so as to adjust the dielectric constant in an appropriate fashion.

Therefore, the present invention 60 includes a vacuum processing chamber 20 which includes a processing chamber 20 defined by a chamber body 21 and wherein the chamber body 21 further defines an internal cavity 31. Still further, the vacuum processing chamber 60 includes first and second electrodes 24 and 25 mounted on the chamber body 21 and which are located within the internal cavity 31. Still further, the present form of the invention as seen by reference to FIG. 5 includes an RF generator 33/34 which produces single or multiple frequencies of electrical energy and which is electrically coupled to at least one of the first or second electrodes. The electrodes are operable, when energized, to produce a plasma 35 within the internal cavity 31. Still further, a ring 51 is fabricated, at least in part, of a dielectric material, and further defines a slot 53. The ring 51 is positioned between the first electrode 24 and the chamber body 21. Still further, in this form of the invention, a liquid 61 is received within the slot that is defined by the ring, and which is operable to adjust the equivalent dielectric constant.

As seen in FIG. 5, a method for processing a semiconductor work piece 32 is provided and which includes the steps of providing a chamber 20 defined by a chamber body 21, and wherein the chamber body further defines an internal cavity 31. The present method includes another step of providing first and second electrodes 24 and 25, and mounting the first and second electrodes on the chamber body 21 and within the internal cavity 31. The present method also includes another step of providing a semiconductor work piece 32, and delivering the semiconductor work piece into the internal cavity 31. The present method includes another step of providing a source of a gas, and introducing the source of the gas into the internal cavity 31; and further providing an RF generator 33/34 which produces single or multiple frequencies of electrical energy, and which is electrically coupled to at least one of the first or second electrodes 24 and 25. The method includes another step of energizing at least one of the electrodes to produce a plasma 35 from the gas which has been delivered into the internal cavity 31 of the chamber body 21. Still further, the method includes another step of positioning a ring 51 defining a slot 53, and which is fabricated, at least in part, of a dielectric material, between the first electrode 24, and the chamber body 21. Still further, the method includes a further step of delivering a source of a liquid 61 into the slot 53 to adjust an equivalent dielectric constant which exists between the first electrode 24 and the chamber body 21. In the methodology as described above, the ring 51 has a top surface 52, and wherein the step of positioning the ring 51 further comprises orienting the ring 51 along the chamber body 21; and positioning the top surface 52 of the ring at a location which is outside of the internal cavity 31. As earlier discussed, the liquid which is provided is typically water, and further the dielectric material is selected from the group which includes porcelain and a silicate.

Figure 6:
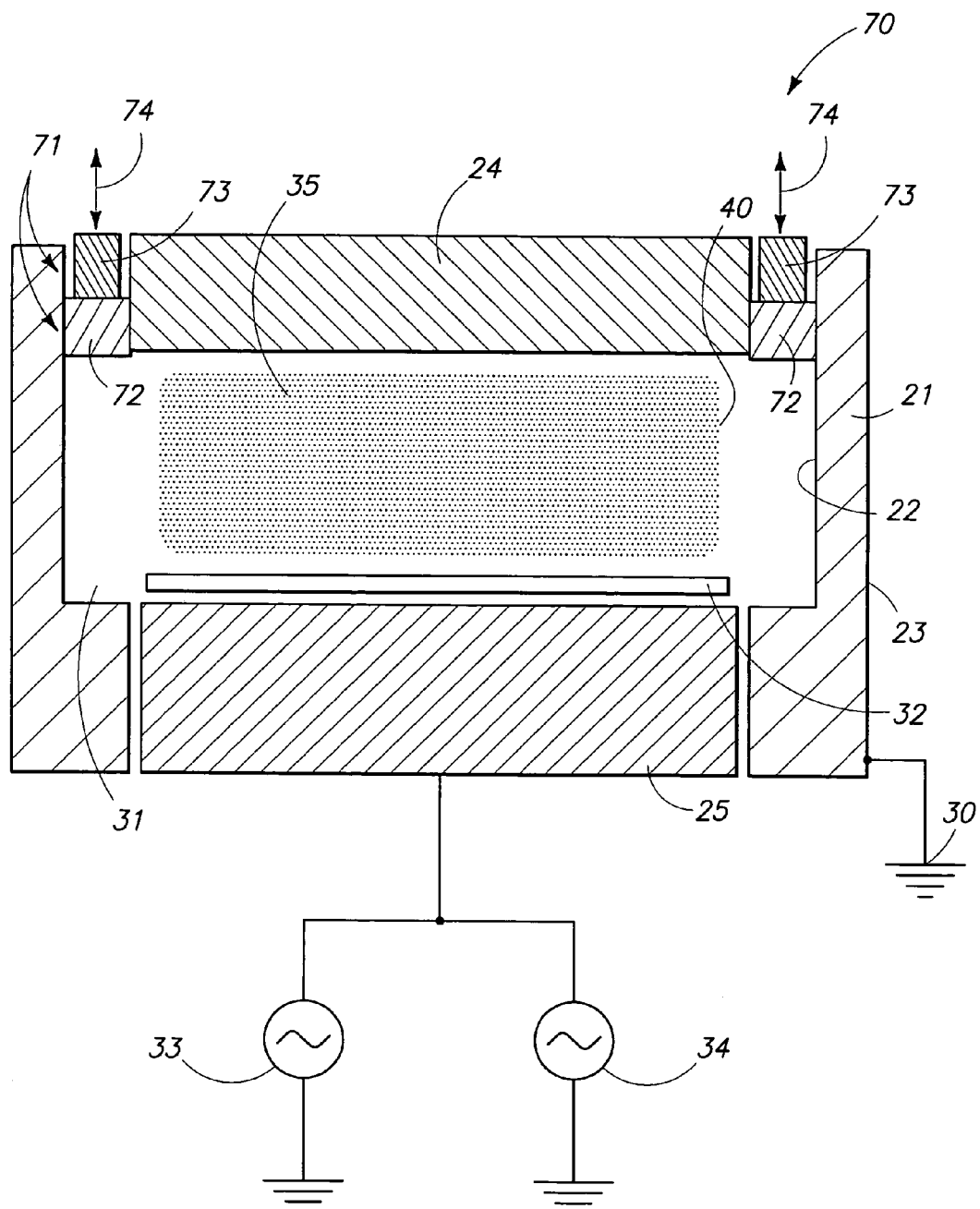
FIG. 6 is a greatly simplified, schematic view of yet another embodiment of the present invention.

Referring now to FIG. 6, a fourth form of the present invention 70 is shown therein. Similar structures bear similar numbers from that earlier described. In the fourth form of the invention 70, as seen in FIG. 3, it will be understood that the fourth form of the invention includes multiple rings which are generally indicated by the numeral 71. The multiple rings include a first solid ring 72, and a second solid ring 73. The first and second rings are positioned therebetween the first electrode 24 and the inside facing surface 22 of the chamber body 21. As should be understood, each of the rings 71 are fabricated from a dielectric material. In one form of the invention as seen in FIG. 6, the first ring 72 is substantially stationary, and the second ring 73 is moveable along a path of travel 74 relative to the chamber body 21, and the adjacent first electrode 24, in order to adjust the dielectric constant. In yet another form of the invention, it should be understood that the first and second rings 72 and 73 may move in unison together along the path of travel 74 in order to provide the benefits as earlier described. As should be understood, the first and second rings may be fabricated from different dielectric materials in order to provide a means for adjusting the equivalent dielectric constant which exists between the first electrode 24 and the chamber body 21. Therefore, in this form of the invention, multiple rings 70 may be provided and which are fabricated, at least in part, of a dielectric material and which are positioned between the first electrode 24 and the chamber body 21. Further, in this form of the invention, at least one of the multiple rings is substantially vertically moveable along the chamber body 21 in order to adjust the equivalent dielectric constant which exists between the chamber body 21 and the first electrode 24.

Figure 7:
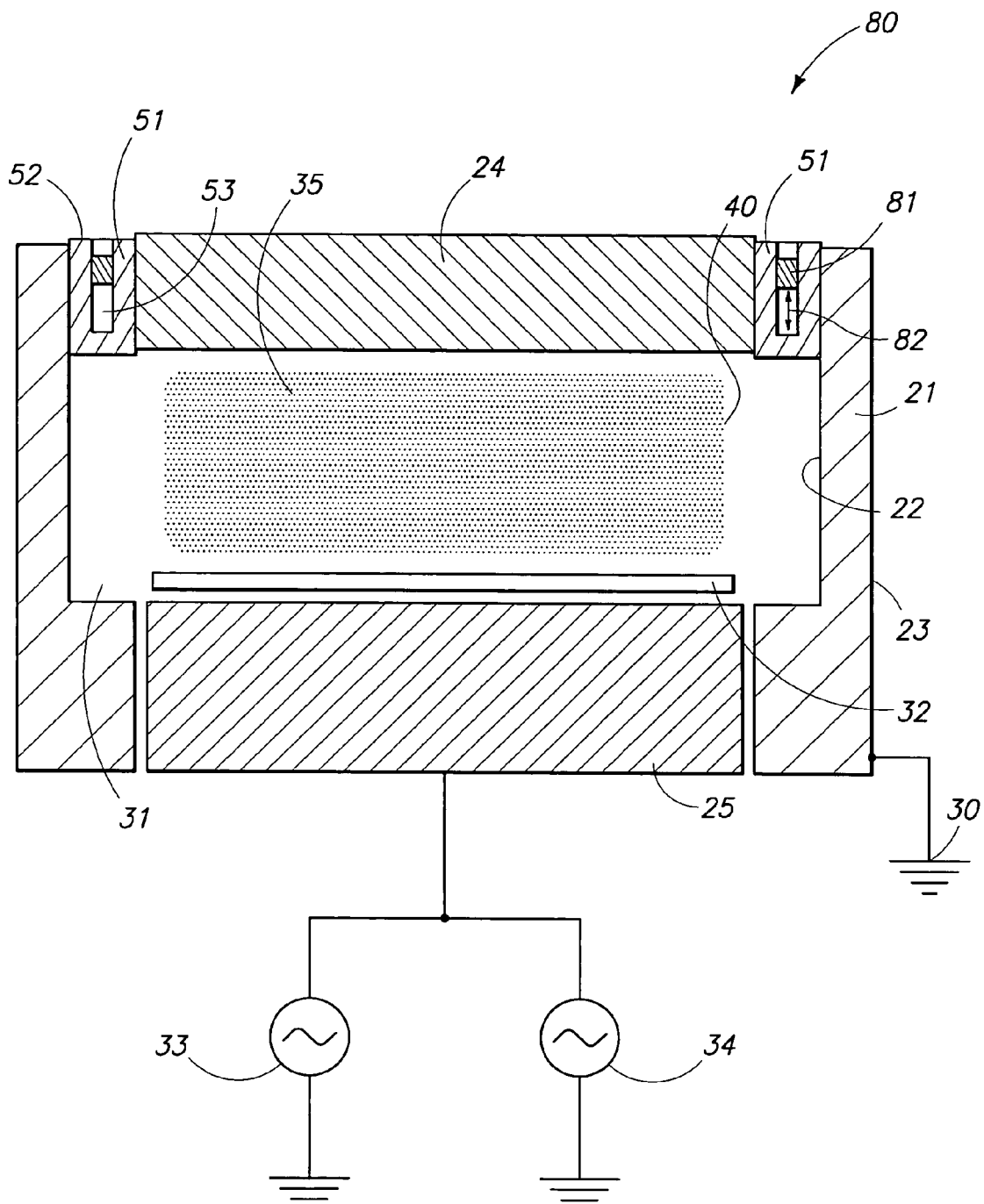
FIG. 7 is a greatly simplified, schematic view of yet another embodiment of the present invention.

Referring now to FIG. 7, a fifth form of the present invention is generally indicated by the numeral 80 therein. As seen, similar structures have similar numbers from that previously described. In the fifth form of the invention as illustrated in FIG. 7, it should be understood that the present invention 80 includes a structure very similar to that seen with the second form of the invention 50. More specifically, in the fifth form of the invention, a hollow ring 51 defining a slot 53 is provided and which is positioned between the first electrode 24 and the inside facing surface 22 of the chamber body 21. Still further, a solid moveable ring 81 is provided therein, and which is moveable along a path of travel 82 within the slot 53 thereby providing a means for adjusting the equivalent dielectric constant which exists between the chamber body 21 and the first electrode 24. As earlier discussed, the hollow ring 51 is formed of a dielectric material selected from the group including porcelain and a silicate. Still further, the solid moveable ring 81 may comprise the same or a different dielectric material and which is useful for adjusting the equivalent dielectric constant. As earlier discussed, the present invention comprises an adjustable component borne by the chamber body 21 and which is fabricated, at least in part, from a dielectric material and which selectively adjusts the equivalent dielectric constant which exists between the chamber body 21, and the first electrode 24. In this form of the invention 80, the material received within the slot 53 comprises a moveable solid block in the form of a ring 81, and wherein the solid block moves along the slot 53 so as to selectively adjust the equivalent dielectric constant. As earlier disclosed with respect to the second form of the invention 50, a liquid 61 may be infused in the slot 53 to perform substantially the same function. As seen in the drawings, the adjustable component can selectively move along a path of travel 82 between the top surface of the chamber body and the first electrode 24.

Figure 8:
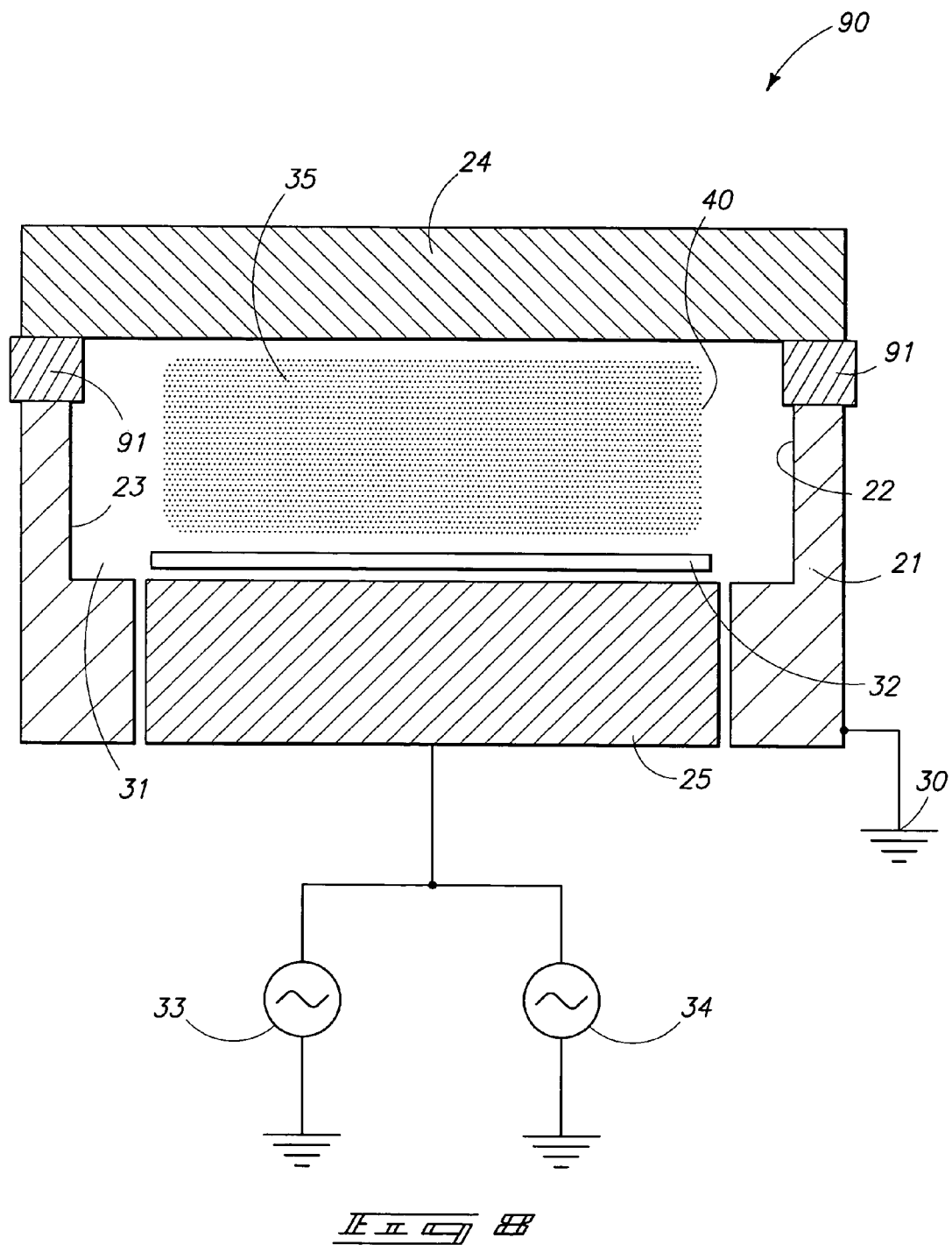
FIG. 8 is a greatly simplified, schematic view of yet another embodiment of the present invention.

Referring now to FIG. 8, a sixth form of the present invention is generally indicated by the numeral 90 therein. As seen in that drawing, a solid ring 91, which is fabricated of the dielectric material, is positioned between the top peripheral edge of the chamber body 21 and the top or first electrode 24. In this arrangement, the adjustable component is a fixed ring 91 of dielectric material which functions to adjust the equivalent dielectric constant which exists between the chamber body 21, and the overlying first electrode 24. This solid ring 91 is fabricated from a dielectric material which includes porcelain and a silicate.

Figure 9:
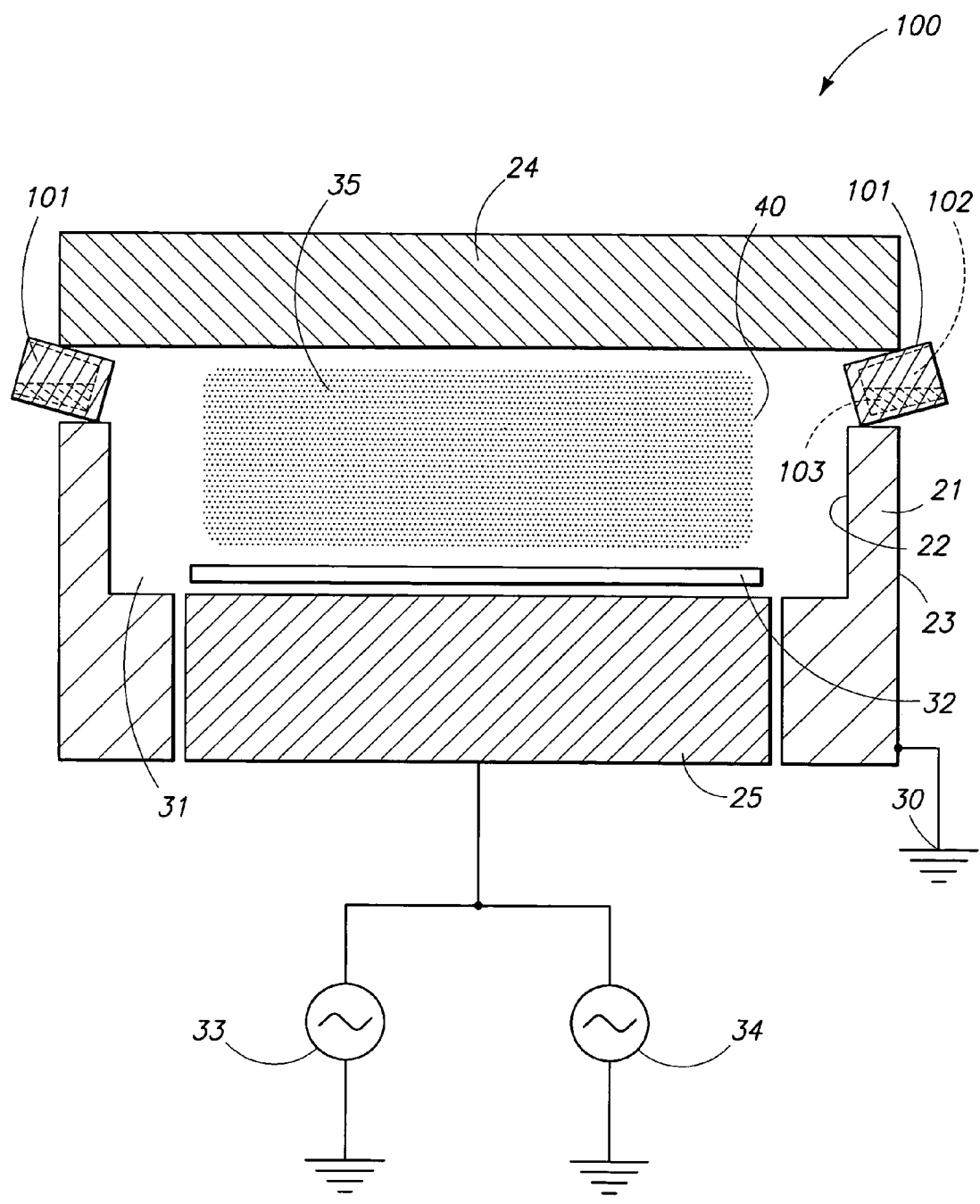
FIG. 9 is a greatly simplified, schematic view of yet another embodiment of the present invention.

Referring now to FIG. 9, a seventh form of the invention 100 is shown. Similar structures bear similar numbers from that previously described. In the seventh form of the invention, a ring of dielectric material 101 is provided and which is positioned between the top peripheral edge of the chamber body 21 and the overlying first electrode 24. As seen in FIG. 9, it should be appreciated that the ring of dielectric material 101 may be substantially solid or in an alternative form, shown in phantom lines, the ring of dielectric material 101 may have a slot 102 formed therein and which functions similar to the slot 53 formed in the hollow ring 51, as seen in the second form of the invention 50. In this regard, the slot or channel 102 is operable to receive a liquid 103, such as water, and which is operable to adjust the equivalent dielectric constant which exists between the first electrode 24 and the chamber body 21. In addition to the foregoing, it should be understood that while a liquid 103 is illustrated as being received in the slot 102, it should be appreciated that a solid block (not shown) may also be received, and move within the channel or slot 102 (not shown). The solid block would operate in a fashion similar to that previously illustrated with respect to the fifth form of the invention 80 as seen in FIG. 7.

Figure 10:
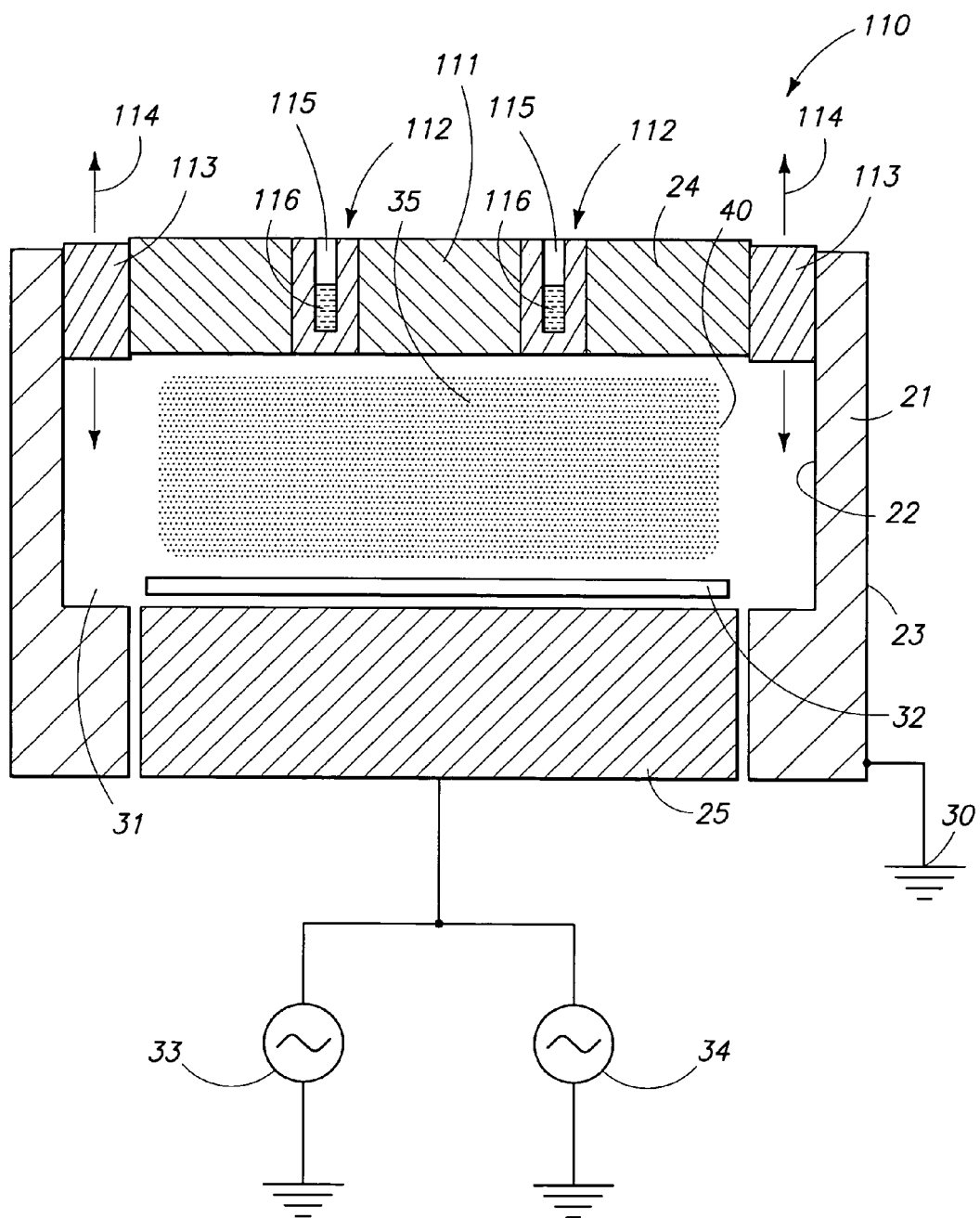
FIG. 10 is a greatly simplified, schematic view of yet another embodiment of the present invention.

Referring now to FIG. 10, an eighth form of the invention is generally indicated by the numeral 110 therein. Similar numbers indicate similar structures from that previously disclosed. In the eighth form of the invention, it will be understood that the present form of the invention includes a third electrode which is generally indicated by the numeral 111. As seen in FIG. 10, the third electrode 111, is disposed in spaced relation relative thereto. The first and third electrodes are typically concentrically oriented one relative to the other. The eighth form of the invention 110 includes a first adjustable component 113; and a second adjustable component 112. The first adjustable component is illustrated as a substantially solid ring, and which is positioned between the first electrode 24 and the inside facing surface 22 of the chamber body 21. The first adjustable component 113 may be stationary, or may be moveable along a substantially vertically disposed path of travel 114 along the chamber body 21 in order to adjust the equivalent dielectric constant which exists between the first electrode 24 and the chamber body 21. As seen, the third electrode 111 is borne by the chamber body 21. Further, the invention includes a second adjustable component 112, here illustrated as a hollow ring, which has a slot 115 defined therein. The slot 115 is operable to receive a fluid such as water 116 therein. The second adjustable component 112 operates in a fashion similar to the hollow ring 51, and the accompanying slot 53 and liquid 61 as discussed with respect to the third form of the invention. Therefore, in this form of the invention 110, the second adjustable component 112 is positioned between the third electrode 111, and the first electrode 24, and the second adjustable component defines a slot 115 which receives a second material such as a liquid 116 or solid, and which is operable to adjust the equivalent dielectric constant which exists between the first electrode 24 and the chamber body 21. As earlier disclosed, the fluid 116 may be infused into the slot in a fashion to finely adjust the dielectric constant as earlier described.

As should be appreciated by a study of FIG. 10 a method of processing a semiconductor work piece 32 includes the following steps; providing a processing chamber 20 defined by a chamber body 21, and wherein the chamber body further defines an internal cavity 31. Further, the method includes the step of providing first and second electrodes 24 and 25 and mounting the first and second electrodes on the chamber body and within the internal cavity 31. The method includes another step of providing a semiconductor work piece 32, and delivering the semiconductor work piece into the internal cavity. The method includes another step of providing a source of a gas and introducing the source of the gas into the internal cavity 31. The method also includes another step of providing an RF generator 34/35 which produces single or multiple frequencies of electrical energy, and which is electrically coupled to at least one of the first or second electrodes; and energizing at least one of the electrodes to produce a plasma 35 from the gas which has been delivered into the internal cavity of the chamber body 21. The method includes another step of positioning multiple rings 112 and 114 which are fabricated, at least in part, of a dielectric material, between the first electrode, and the chamber body, and moving at least one of the rings in a vertical direction along the chamber body 21. The multiple rings include a first ring, and a solid second ring. In the arrangement as seen, the first ring defines a slot 115. The method includes another step of providing a liquid and delivering the liquid 116 into the slot 115 which is defined by the first ring 112; and adjusting an equivalent dielectric constant which exists between the first electrode 24 and the chamber body 21 by delivering the liquid into the slot 116 which is defined by the first ring 112, and by moving the second ring 113 which is a solid relative to the chamber body. As should be understood, the dielectric material comprises porcelain or a silicate, and the liquid which is provided in the slot 116 is typically water. In the present arrangement, the first ring 112 has a top surface, and the step of positioning the multiple rings further comprises positioning the top surface of the first ring 112 at a location which is outside of the internal cavity.

Therefore, the present invention provides a convenient means for eliminating or substantially diminishing the edge effect which has plagued the semiconductor industry and which has reduced the yields possible from vacuum processing chambers of similar design.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A vacuum processing chamber, comprising: a chamber defined by a chamber body, and wherein the chamber body further defines an internal cavity; first and second electrodes mounted on the chamber body; an RF generator which produces single or multiple frequencies and which is electrically coupled to at least one of the first or second electrodes, and which is further operable, when energized, to produce a plasma within the internal cavity of the chamber body; and an adjustable component borne by the chamber body, and which is fabricated, at least in part, from a dielectric material, and which is operable to selectively adjusts the equivalent dielectric constant which exists between the chamber body and the first electrode, wherein the adjustable component further defines a slot which receives a material which adjusts the equivalent dielectric constant and wherein the material received in the slot comprises a liquid.

2. A vacuum processing chamber as claimed in claim 1, and wherein the adjustable component is fixed relative to the chamber body.

3. A vacuum processing chamber as claimed in claim 1, and wherein the adjustable component is moveable relative the chamber body.

4. A vacuum processing chamber as claimed in claim 1, and wherein the chamber body has an inwardly facing surface, and wherein the adjustable component is located between the inwardly facing surface of the chamber body, and the first electrode.

5. A vacuum processing chamber as claimed in claim 1, and wherein the chamber body has a top surface, and a sidewall having an inwardly facing surface, and wherein the adjustable component is located, at least in part, between the top surface of the chamber body, and the first electrode, and between the inwardly facing surface of the chamber body sidewall, and the first electrode.

6. A vacuum processing chamber as claimed in claim 1, and wherein the adjustable component comprises a hollow ring.

7. A vacuum processing chamber as claimed in claim 4, and wherein the adjustable component can move in a vertical direction between the inwardly facing surface of the chamber body and the first electrode to adjust the equivalent dielectric constant.

8. A vacuum processing chamber as claimed in claim 1, and wherein the chamber body is electrically grounded.

9. A vacuum processing chamber, comprising: a chamber defined by a chamber body, and wherein the chamber body further defines an internal cavity; first and second electrodes mounted on the chamber body; an RF generator which produces single or multiple frequencies and which is electrically coupled to at least one of the first or second electrodes, and which is further operable, when energized, to produce a plasma within the internal cavity of the chamber body; a ring which is fabricated, at least in part of a dielectric material, and which further defines a slot, and wherein the ring is positioned between the first electrode and the chamber body; and a liquid received in the slot which is defined by the ring.

10. A vacuum processing chamber as claimed in claim 9, and wherein the dielectric material comprises porcelain.

11. A vacuum processing chamber as claimed in claim 9, and wherein the liquid comprises, at least in part, water.

12. A vacuum processing chamber as claimed in claim 9, and wherein the ring extends, at least in part, along the chamber body, and has a top surface which is positioned in a location which is outside of the internal cavity.

13. A vacuum processing chamber as claimed in claim 9 and wherein the ring is stationary or moveable.

* * * * *